US010054695B2

United States Patent
Lee et al.

(10) Patent No.: US 10,054,695 B2
(45) Date of Patent: Aug. 21, 2018

(54) RADIATION IMAGING DETECTOR WITH PROPORTIONAL CHARGE GAIN DURING READOUT

(71) Applicant: Vieworks Co., Ltd., Gyeonggi-do (KR)

(72) Inventors: Denny Lap Yen Lee, Westchester, PA (US); Hyun Suk Jang, Gyeonggi-do (KR)

(73) Assignee: Vieworks Co., Ltd., Anyang-si, Gyeonggi-do (KR)

( * ) Notice: Subject to any disclaimer, the term of this patent is extended or adjusted under 35 U.S.C. 154(b) by 0 days.

(21) Appl. No.: 15/476,195

(22) Filed: Mar. 31, 2017

(65) Prior Publication Data

US 2017/0285190 A1    Oct. 5, 2017

Related U.S. Application Data

(60) Provisional application No. 62/316,054, filed on Mar. 31, 2016.

(51) Int. Cl.
*G01T 1/24* (2006.01)
*H01L 27/146* (2006.01)

(52) U.S. Cl.
CPC ............. *G01T 1/247* (2013.01); *G01T 1/241* (2013.01); *H01L 27/14603* (2013.01); *H01L 27/14676* (2013.01)

(58) Field of Classification Search
CPC ............. G01T 1/241; H01L 27/14603; H01L 27/14678; H01L 27/3274
See application file for complete search history.

(56) References Cited

U.S. PATENT DOCUMENTS

5,262,649 A    11/1993    Antonuk et al.
5,319,206 A    6/1994    Lee et al.

*Primary Examiner* — David Porta
*Assistant Examiner* — Faye Boosalis
(74) *Attorney, Agent, or Firm* — Saliwanchik, Lloyd & Eisenschenk (57) ABSTRACT

The invention relates to a two steps image capture panel for recording x-ray image information. More particularly, the invention relates to a method and an apparatus for directing the internal electric field to capture the x-ray image first on an insulating surface, avoiding charge injection noise from the insulating surface, and then re-directing the internal electrical field to transfer the image charge from the insulating surface to a conductive readout electrode with electric field sufficient for charge gain during image readout.

15 Claims, 9 Drawing Sheets

RADIATION IMAGING DETECTOR WITH PROPORTIONAL CHARGE GAIN DURING READOUT

CROSS REFERENCE TO RELATED APPLICATION

The application claims priority to U.S. Provisional Application No. 62/316,054, filed Mar. 31, 2016, which is hereby incorporated by reference in its entirety.

BACKGROUND

Field of Invention

The invention relates to a two steps image capture panel for recording x-ray image information. More particularly, the invention relates to a method and an apparatus for directing the internal electric field to capture the x-ray image first on an insulating surface, avoiding charge injection noise from the insulating surface, and then re-directing the internal electrical field to transfer the image charge from the insulating surface to a conductive readout electrode with electric field sufficient for charge gain during image readout.

Description of Related Art

Digital X-ray radiogram can be produced by using layers of radiation sensitive materials to capture incident X-ray as image-wise modulated patterns of light intensity (photons) or as the electrical charges. Depending on the intensity of the incident X-ray radiation, the absorbed energy is directly converted to electrical charges by an x-ray photoconductor is directed to a regularly arranged array of discrete solid state radiation sensors. U.S. Pat. No. 5,319,206, issued to Lee et al. on Jun. 7, 1994 describes a system employing a layer of photoconductive material to create an image-wise modulated areal distribution of electron-hole pairs that are subsequently collected by a two dimensional array of pixels with charge storage capacitors and transistors, such as thin-film transistors (TFT) array. Digital X-ray images can also be obtained by first converting the absorbed energy to visible light and then digitizing the light pattern to electrical signal. U.S. Pat. No. 5,262,649 (Antonuk et al.) describes a system employing a layer of phosphor or scintillation material to create an image-wise modulated distribution of photons that are subsequently converted to a corresponding image-wise modulated distribution of electrical charges by photosensitive devices, such as two dimensional amorphous silicon photodiodes array. Both of these systems have the advantage of being useful for repeated exposures to X-ray radiation without consumption of chemicals or the processing of silver halide films.

In Indirect Conversion systems (e.g. U.S. Pat. No. 5,262,649) that utilize a scintillation material to create an image-wise modulated distribution of photons from the absorbed X-ray energy, photons generated from the absorbed X-ray may undergo multiple scattering or spreading before they are detected by the two dimensional photosensitive device, resulting with degradation of image sharpness or a lower Modulation Transfer Function (MTF). The degradation of image sharpness is significant especially when a thicker layer of scintillation material is required to capture sufficient x-ray quanta for image forming.

Figure 1:
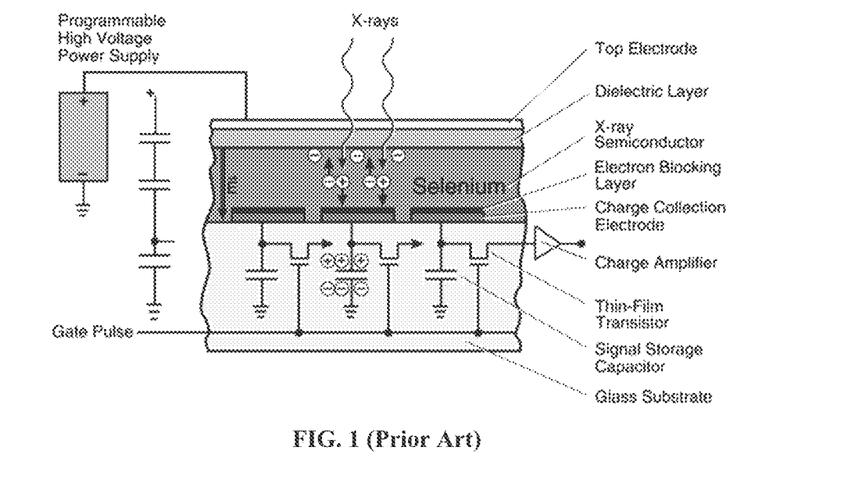
FIG. 1 shows a prior art flat panel x-ray detector using thin-film transistors (TFT)
Figure 2:
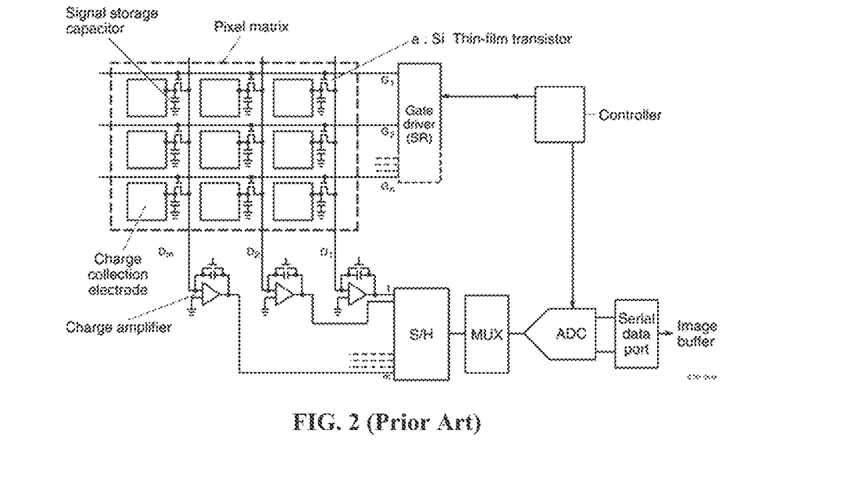
FIG. 2 shows the arrangement of gate lines and data lines in a conventional TFT array.

In Direct Conversion systems (FIG. 1, FIG. 2) utilizing a photoconductive material, such as selenium described in U.S. Pat. No. 5,319,206, before exposure to image-wise modulated X-ray radiation, an electrical potential is applied to the top electrode to provide an appropriate electric field. During exposure to X-ray radiation, electron-hole pairs (indicated as − and +) are generated in the photoconductive layer (referred to in FIG. 1 as "X-ray Semiconductor") in response to the intensity of the image-wise modulated pattern of X-ray radiation, and these electron-hole pairs are separated by the applied biasing electric field supplied by a high voltage power supply. The electron-hole pairs move in opposite directions along the electric field lines toward the opposing surfaces of the photoconductive layer. After the X-ray radiation exposure, a charge image is held in the conductive surface of a storage capacitor of the TFT array. This image charge is then readout by an orthogonal array of thin film transistors and charge integrating amplifiers. In Direct Conversion systems, since the electric field is directing charges to the collecting electrode, the image sharpness or MTF is preserved regardless of the thickness of the photoconductive material. Thicker X-ray conversion material can be used to absorb sufficient X-ray energy without compromising the resulted image quality. However, when direct conversion material such as amorphous selenium is used, during charge collection, electric field of 5 volts per micron or up to 40 volts per micron is used to generate the image charge from x-ray and to move the charge all the way to the collecting electrode. Under this bias electric field, a significant amount of leakage current can also be injected from the conductive charge collection, resulting with a significant amount dark current. The charges from this dark current may decrease of image dynamic range and increase the image noise. It is therefore desirable to have a detecting system without charge injection noise from the charge collection surface even under very high electric field.

Furthermore, the conventional large area thin film transistor arrays used for both Direct Conversion systems and Indirect Conversion systems consist of a large number of image data lines and control gates lines orthogonal to each other. During the readout process, when each gate line is turned on, the gate control voltage is normally switched from a negative voltage of about −5 volts for the TFT "off" state to a positive voltage of +7 volts or higher for the TFT "on" state. This swing of 12 volts or more of the gate control voltage ($\Delta V$) will inject a charge $\Delta Q_{dg}$ equals to the $\Delta V$ times the coupling capacitance $C_{gd}$ between the TFT gate electrode and the drain electrode to the TFT storage capacitor. A similar charge $\Delta Q_{gs}$ will also inject to the data line connecting to the charge amplifier, where $\Delta V$ is the change of control gate voltage from an off state to an on state and where Cgs is the parasitic capacitance between the gate terminal and the source terminal of the field effect transistor (FET) in the TFT. After the image charge from each data line is integrated or collected by the charge amplifier, the gate line voltage will switch from positive to negative to turn off all transistors on the same line. Negative charges $-\Delta Q_{gd}$ and $-\Delta Q_{gs}$ equal to $\Delta V$ times $C_{gd}$ and $C_{gs}$ will then be extracted from the image storage capacitor and the data line. In the ideal situation, the injected $\Delta Q_{gd}$ and $\Delta Q_{gs}$ during the gate-on process should equal to the $-\Delta Q_{gd}$ and $-\Delta Q_{gs}$ during the gate-off process. However, because of the hysteresis of the FET transistor, the magnitude of $\Delta Q_{gd}$ and $\Delta Q_{gs}$ may not be exactly the same as the magnitude of $-\Delta Q_{gd}$ and $-\Delta Q_{gs}$. A small amount of net charge is therefore included in this image charge transfer process as additional noise. Even in the ideal condition of $\Delta Q_{gd}$ and $\Delta Q_{gs}$ are having the magnitude of $-\Delta Q_{gd}$ and $-\Delta Q_{gs}$, the statistical Poison noise of the number of electrons $\Delta N_e$ injected in each gate transition is equal to the square root of the number electrons $N_e$ of each transition. In each gate switching cycle, even when the average charge $\Delta Q$ cancels the average charge $-\Delta Q_o$ exactly, a noise component equals to square root 2 (1.4142) times the square root of $N_e$ will still remain. This kind of noise is commonly known as TFT switching noise and is again undesirable for low signal or low radiation dose x-ray images. Such TFT switching noise is therefore a significant disadvantage of systems using thin-film-transistor arrays (TFT) known in the art.

The goal of the invention has therefore been to provide a detector system that is able to perform low noise image capture avoiding charge injection noise from high bias electric field and avoiding the significant disadvantages of Thin Film Transistor (TFT) arrays switching noise. The invention has solved this problem by providing the radiation imaging detector and a method of using such detector for detecting radiation as described herein and according to the claims. The invention further provides a method of constructing an imaging array without using TFT for low noise operations. Furthermore, the technique of correlated double sampling (CDS) can be applied after the reconfiguration of the electric field from x-ray image acquisition mode to readout mode to minimize the readout line reset noise and thermal KTC noise. Ultra-low noise readout can be performed. Since no amorphous silicon transistors or TFT is used in the pixel array, materials that required thermal deposition temperature of higher than 300 degree C. can be used with this detector without causing damages to the readout array. Electro-static discharge damage (ESD) that can cause pixel defects in TFT is no longer a concern with the novel readout array of this invention. Without the use of amorphous silicon transistor and without the special handling to avoid ESD damage to transistors, the fabrication cost of this novel transistor-less array can be substantially lower than the conventional TFT arrays. Large size arrays can also be made without the limitation of current TFT fabrication tools.

All references cited herein are incorporated herein by reference in their entireties.

BRIEF DESCRIPTION OF THE DRAWINGS

The invention is described in conjunction with the following drawings in which like reference numerals designate like elements and wherein.

DETAILED DESCRIPTION

The invention provides a flat panel comprising a top electrode, a layer of photoconductive material (e.g. Selenium) deposited on a plurality of two dimensional matrix pixel elements. The plurality of pixel elements include a non-conductive charge accumulation area in each pixel, a plurality of readout electrodes arranged in rows and a plurality of buried electrodes underneath the non-conductive charge accumulation area arranged in columns. The column buried electrodes are insolated from the photo-conductive material by dielectric material. At least one part of the readout electrode within a pixel area is not covered by dielectric material and is in contact with the photo-conductive layer.

Figure 7:
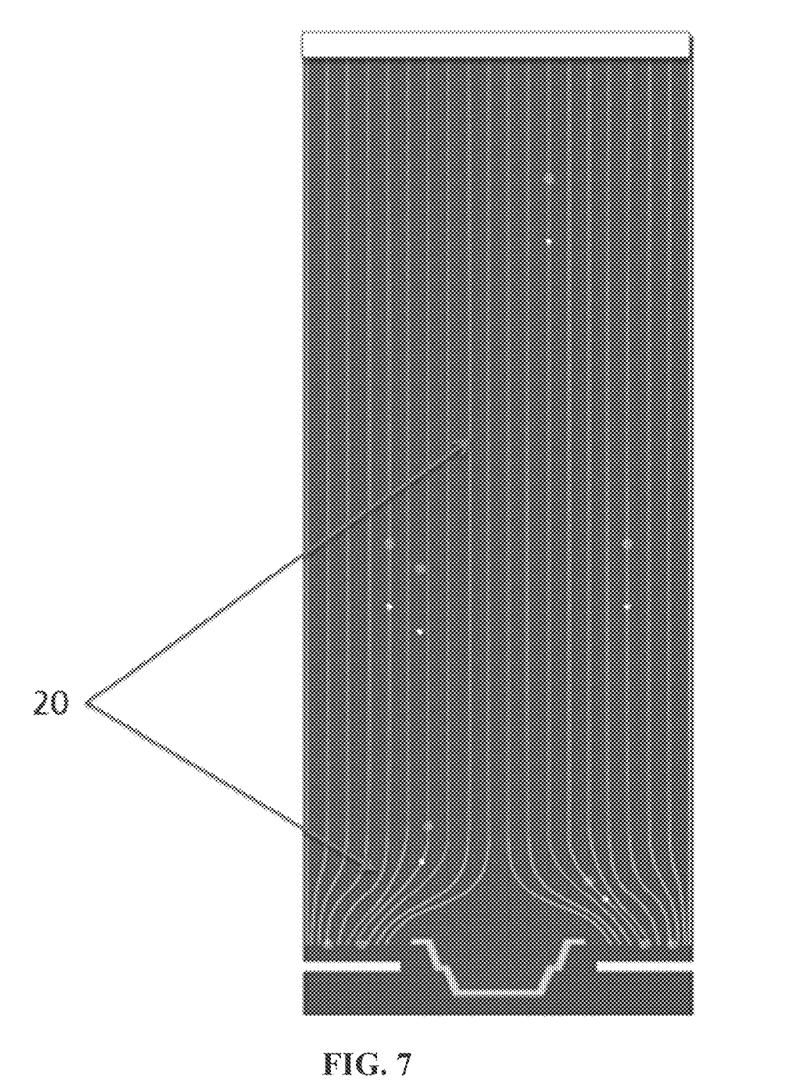
FIG. 7 shows the electrical field lines of the detector and the charge movement in x-ray image accumulating mode.

A bias voltage VT1 is applied to the top electrode. Readout electrodes are connected to a plurality of readout amplifiers with a potential VS1 of near ground potential. Column buried electrodes are connected to a plurality of column selection drivers with a switchable potential of VP1 and VP2. During x-ray image acquisition mode, the combined potentials of VT1, VS1, and VP1 will produced a set of mostly parallel electric fields in the bulk of the photo-conductive material above the plane of the buried electrode, and bending the field to avoid terminating the electric field on the conductive part of the readout electrode. The field is directed to be terminated on the non-conductive area in above the column of buried electrode in each pixel as shown in FIG. 7. Upon the interaction with x-ray, charges generated in the photo-conductive layer is directed by the electric field and is accumulated on the non-conductive area above the buried electrode as shown in FIG. 7. Charges accumulated in each pixel are held by the electric field between the non-conductive surface and the buried column potential VP1. During the image readout phase, the potential of one of the column buried electrode is changed to VP2 re-directing the charge held at the non-conductive surface to the rows of readout electrodes connected with the plurality of readout amplifiers. Over a certain value of VP2, the electric field terminating at the readout electrode during this readout mode may exceed the threshold of proportional gain potential (about 80 volts per micron for selenium). Charges moving from the non-conductive surface to the readout electrode will then undergo proportional multiplication before being collected by the respective readout amplifier.

The image charge with proportional gain is then integrated by the charge amplifiers, digitized and stored by the imaging computer. Upon the completion of the charge integration of all the rows, the potential of the respective column electrode is returned to VP1 and the potential of the next column is changed to VP2 to transfer charges to the rows of charge integrating amplifiers until the x-ray image of the entire panel is readout. During the charge accumulating process or the readout process, the potential of the top electrode may remain constant and the entire panel except the one column being readout may continue to accumulate x-ray image charge. With a rolling readout scheme of changing the potential of one selected column of buried electrode at a time, continuous dynamic imaging may be obtained.

Figure 3:
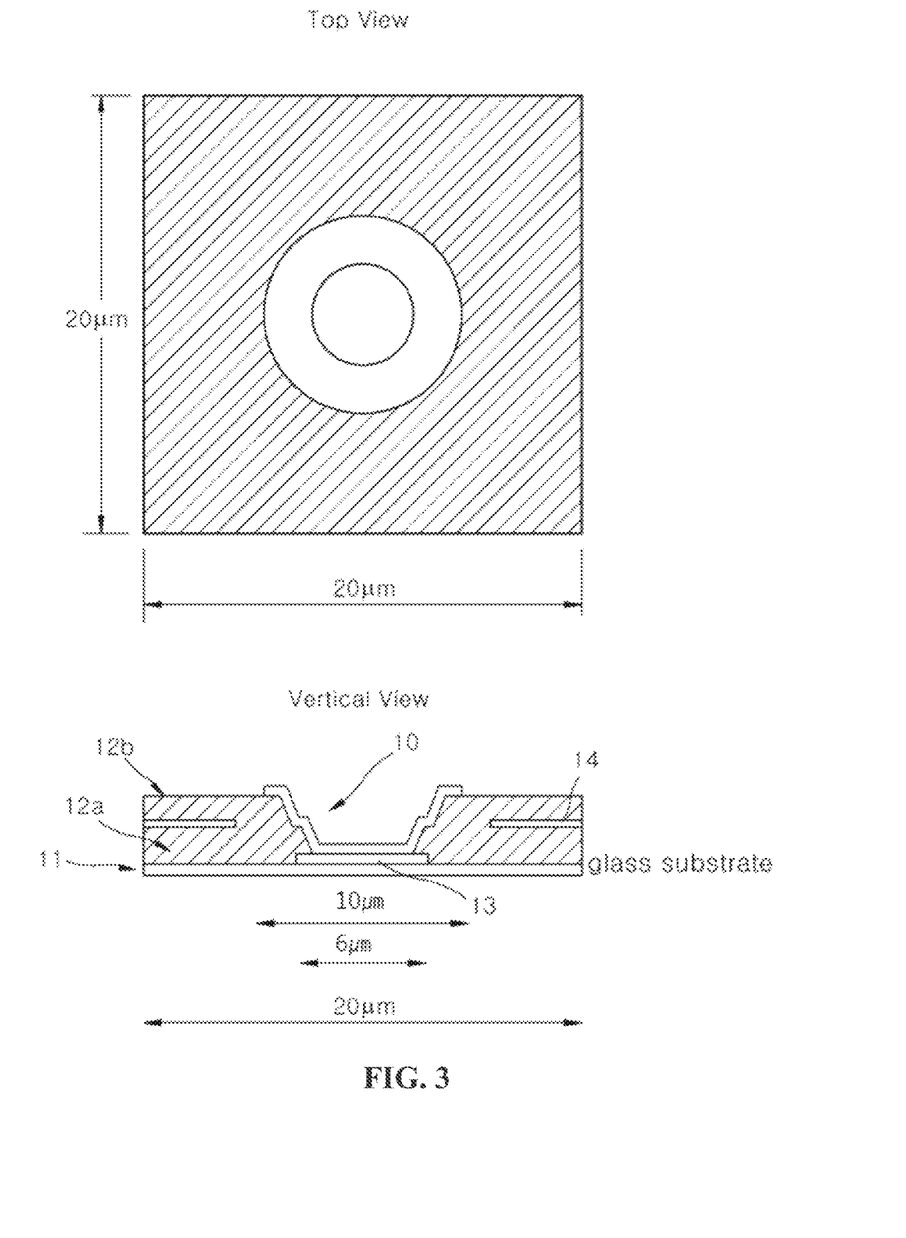
FIG. 3 depicts the structure of one single pixel of this invention showing an arrangement of buried field shaping electrode, dielectric pixel area, and the data readout electrode.
Figure 4:
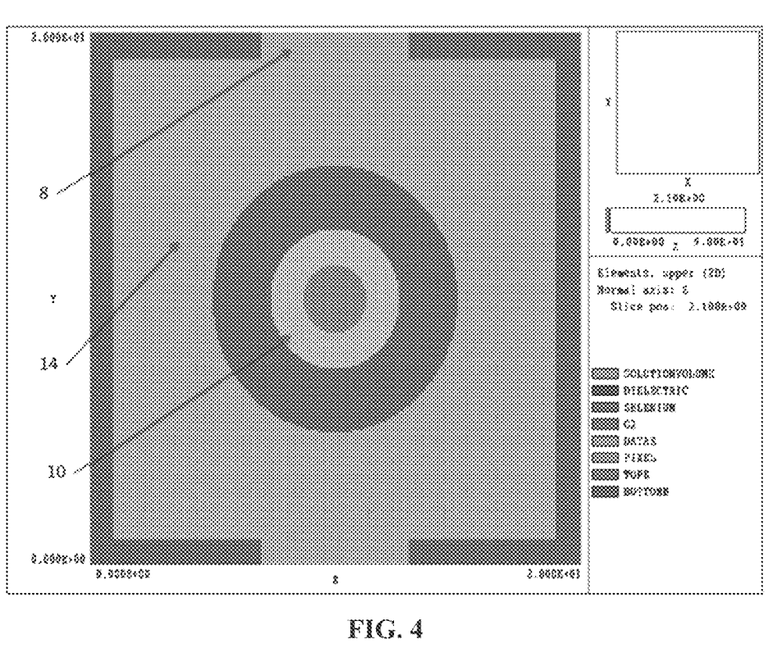
FIG. 4 shows the pixel cross-section along the buried electrode.
Figure 6:
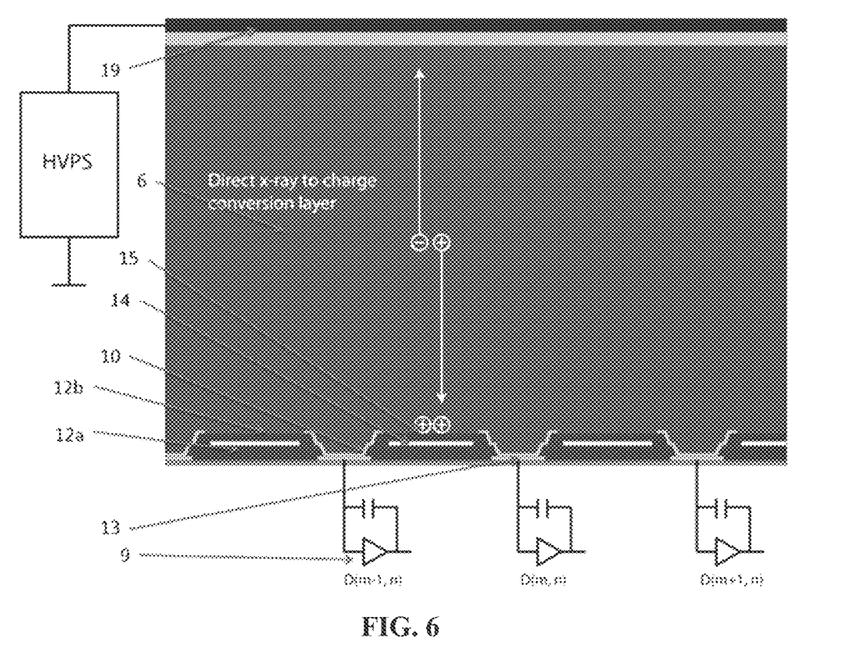
FIG. 6 shows the vertical cross-section of the detector.

Referring to FIGS. 3, 4 and 6, in an embodiment of the invention, the invention provides a radiation imaging detector comprising: a) a first dielectric layer (11), b) a plurality of row readout electrodes (13) deposited on the dielectric layers (11), c) a second dielectric layer (12a) deposited over the first dielectric layer (11), d) a plurality of column buried electrodes (14) deposited on the second dielectric layers (12a), e) a third dielectric layer (12b) deposited over the second dielectric layer (12a) and the buried electrode, f) a plurality of vias (10) penetrating the dielectric layers to the row readout electrode (13).

In a further embodiment of the invention, the radiation imaging detector can further comprise: u) a plurality of column pixel lines (8), column pixel lines (8) are necessary elements of the invention (refer to FIG. 4)

Figure 5:
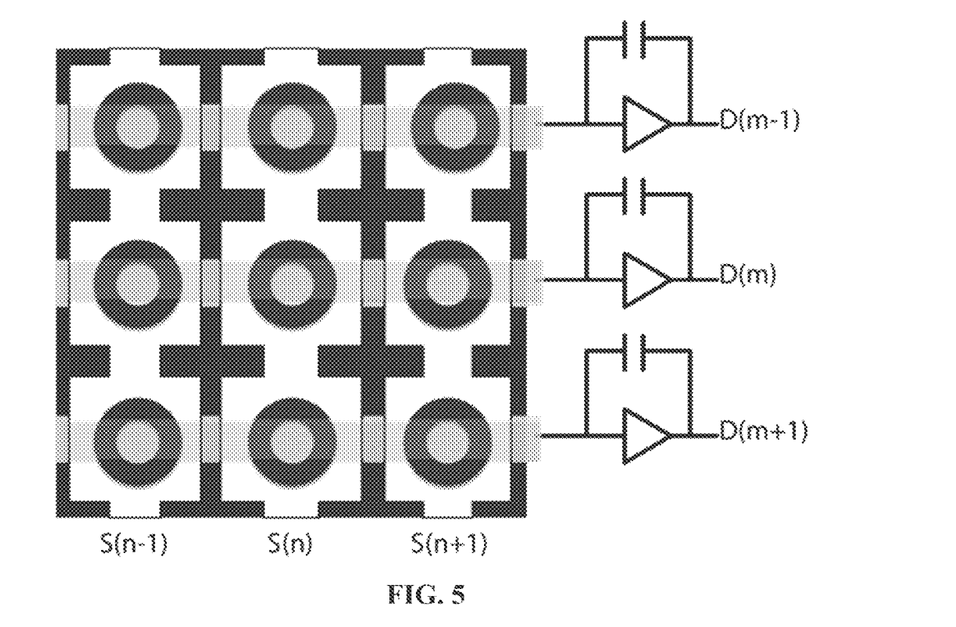
FIG. 5 shows the orthogonal addressing and readout circuits.

In a further embodiment of the invention, the radiation imaging detector can further comprise: 1) a plurality of charge amplifiers (9) connected to each row of the readout electrodes (13) to form a radiation image (refer to FIG. 5 and FIG. 6).

In some embodiments of the radiation imaging detector of the invention, the dielectric layers (12a) and (12b) can comprise silicon dioxide ($SiO_2$).

The invention further provides the use of the radiation imaging detector of the invention as described herein for detecting radiation.

The invention further provides a method for detecting radiation comprising the steps of: a) providing the radiation imaging detector of the invention, b) generating a read out image signal, and c) detecting said read out image signal.

In one embodiment of the method of the invention, step b) can comprise: i) applying a first bias potential to the top bias electrode (19) to direct the radiation generated charges to move away from the top electrode (19), ii) applying a second bias potential to the buried electrodes (14) to direct the charges away from the readout via (10), and to direct the charges to the interface between the dielectric layer (15) and the radiation charge conversion layer (6) (refer to FIG. 6). FIG. 7 shows the shape of the electrical field line (20) in this charge accumulation method.

The radiation charge conversion layer (6), such as amorphous selenium with sufficient thickness for radiation absorption is deposited on top of the said third dielectric layer (12b) and data vias (10), wherein the latter is connected to the readout electrodes (13). A top bias electrode (19) is then deposited on the top surface of the radiation charge conversion layer (6). During x-ray image acquisition, a high voltage bias, the first bias potential, is applied to the top bias electrode (19), developing an electric field between the top electrode and the buried electrodes, and the charge accumulating dielectric area (15). With the exposure of radiation, electron-hole pairs will be generated in the radiation charge conversion layer (6). Depending on the polarity of the high voltage bias, either holes (positively charged) or electrons (negatively charged) will be driven toward the bottom layer of the detector. In this example, to illustrate the principle of the detector of the invention, a positive high voltage bias is used. Holes generated by the radiation such as x-ray will be driven by the bias field toward the bottom of the detector, to the top of the third dielectric layer (15). A negative bias potential is also applied to the buried Electrodes (14) adjacent to the data via (10), connected to the readout lines (13) arranged in rows. Since each of the data lines (13) and the readout via (10) is connected to a charge integrating amplifier (9), or charge amplifier (9), the data line and via potential are at zero volt, or near zero volts. With appropriate voltages, all the electric field lines starting from the top high voltage electrode (19) will be directed to the bottom of the detector and all ending on the charge accumulating dielectric area (15) above the negative potential of buried electrode (14). Holes generated by the radiation within one pixel area will be accumulated at this pixel dielectric interface. At the end of x-ray exposure, or during the rolling readout phase, the potential of one column of buried electrode (14) will be changed from negative to positive. The direction of the electric field on the dielectric on charge accumulation dielectric area (10) above this said selected line (14) or column pixel line (8) will be reversed. The charges accumulated on the dielectric interface (15) of this line will move along the reverse field (16) to the adjacent data electrode connected to the readout lines (refer to FIG. 8). Charges accumulated on each of the dielectric charge accumulation area will be transferred to the data lines adjacent to the respective pixel on the said selected line (8), or column pixel line (8). Charges of each pixel along the charge accumulating dielectric area (10) will be integrated by the plurality of charge amplifiers (9) connected to each data line (13) or readout via (10) and the resulting charge value will be digitized and stored in the computer memories. After one line of charges are integrated and stored, the potential of the pixel buried electrode (14) will be returned to negative and the potential of the next pixel selection line will be changed to positive value, reversing the electric field on the charge accumulation dielectric area of this next line. Pixel charges previously accumulated on this area will then be transferred to the orthogonal data lines adjacent to the pixel. This action will be repeated until the image charge of the whole panel is read out.

Conventional TFT panels in the Prior Arts consist of orthogonal arrays of pixels addressed by orthogonal gate lines and data lines. The thickness of the insulating material between the gate lines and the data lines is typically 200 nm to 400 nm normally limited by the TFT manufacturing process. The parasitic capacitance from the crossover of these gate lines and data lines inside the TFT structure result in a sizable data line capacitance. When charge amplifiers are used for the readout of image information, the thermal noise is greatly amplified by the ratio of the data line capacitance and the feedback capacitor of the charge amplifier. The switching of the gate voltage that is typically 12 volts or higher also contributes to the switching noise in the readout image. However, in the present invention, conventional TFT manufacturing process is not used. The insulating spacing in the crossing of data lines to the orthogonal buried Electrode lines and data lines can be greatly increased. The parasitic capacitance of the data line therefore can be greatly decreased resulting with much less noise amplification in the charge integrating amplifiers.

EXAMPLE

Figure 8:
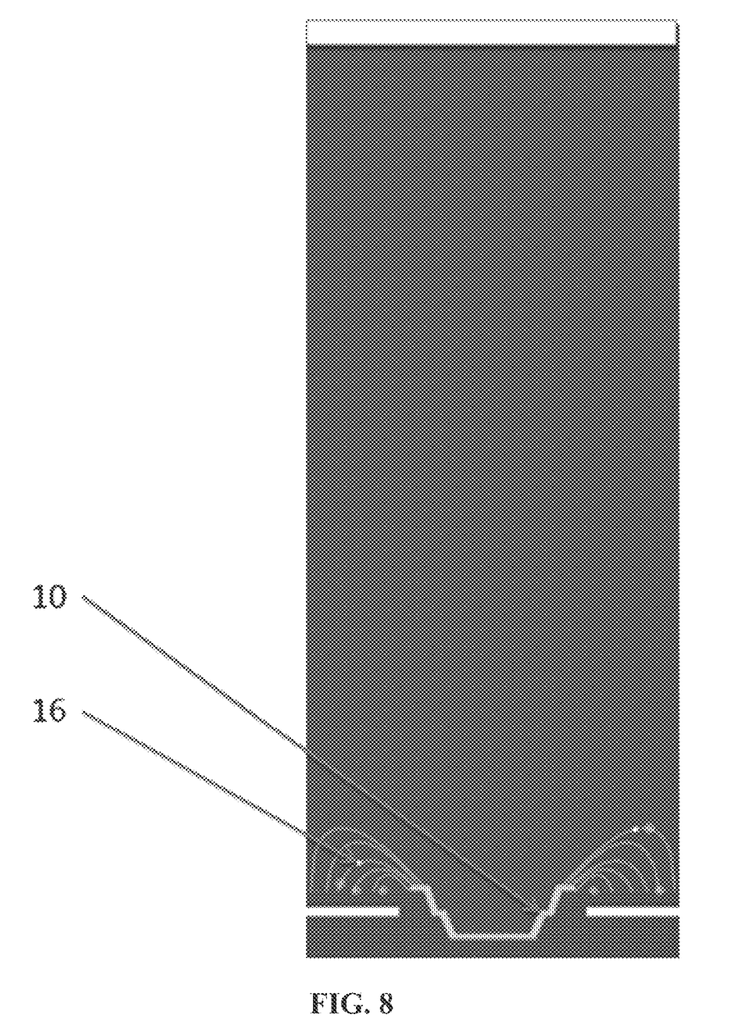
FIG. 8 shows the electrical field lines of the detector and the charge movement in x-ray image readout mode.
Figure 9:
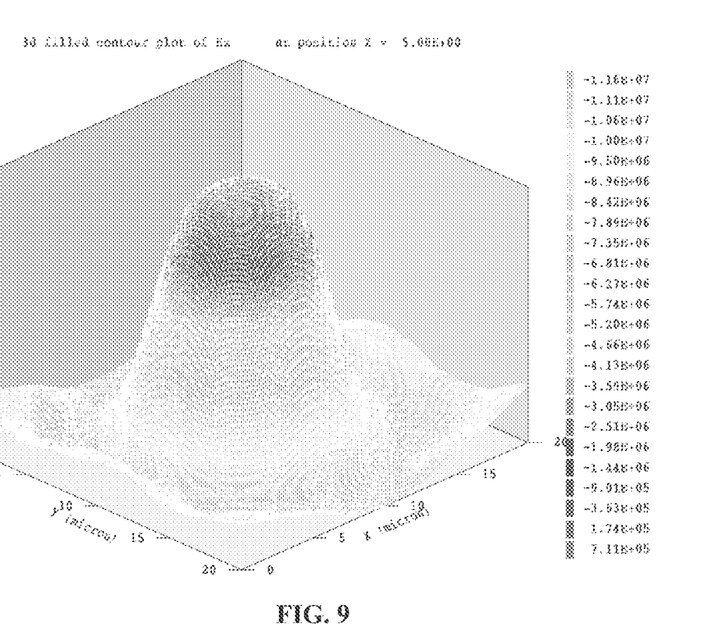
FIG. 9 shows the electrical field distribution of the detector in image accumulating mode.
Figure 10:
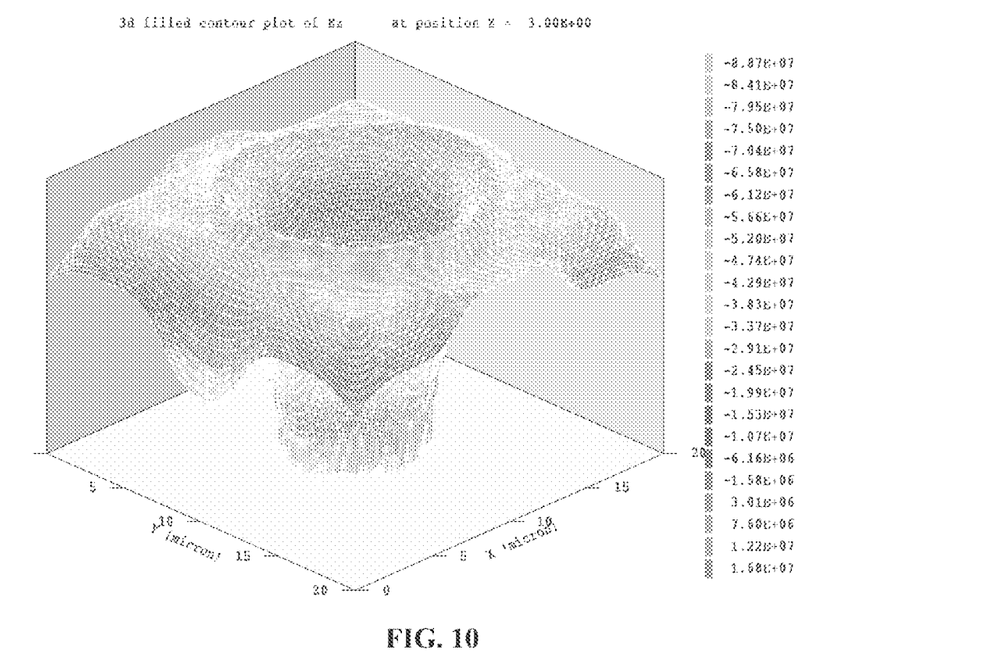
FIG. 10 shows the electrical field distribution of the detector in readout and proportional gain mode.

In this example, a positive voltage of 1 KV over 200 µm of selenium was used resulting with an electric field of 5 volts per micron throughout most of the bulk of selenium layer. A potential of −50V was applied to the buried electrodes (14). As shown in FIG. 7, with the output data electrodes (13) connected to the charge amplifiers (9), the potential of the data electrodes was near zero volts range. A negative voltage of −50 volts was applied to the buried electrodes (14). With this distribution of potentials, all the electric field lines (20) starting from the top high voltage bias electrode terminated on the top surface of the third dielectric material (15) above the pixel buried electrodes (14). Upon exposure of x-ray radiation, electron-hole pairs were generated in the selenium layer proportional to the intensity of the radiation absorbed. Electrons were driven by the electric field to the top high voltage electrode (19) and holes were driven by the electric field (20) to the bottom of the detector. Since all the electric field lines (20) with the distribution of potentials were terminated on the dielectric area (15) above the pixel selection electrodes (14), all the x-ray radiation generated holes were driven by the electric field (20) and were accumulated on the dielectric interface (15) separating the selenium layer (6) and the pixel buried electrode (14) as shown in FIG. 7. At the end of the x-ray exposure, the x-ray image was represented by the amount of charges accumulated over the detector on the dielectric area (15) above each pixel electrode (14). When the panel was ready for readout, one column of the pixel buried electrode potential was changed from a negative voltage to positive, such as from +100 volts above the readout electrode. With this change, the electric field above the pixel selection electrode were reversed and the electric field lines (16) initiated from the dielectric interface and terminated at the output data via (10) that was still at about zero volts (refer to FIG. 8). Positively charged holes accumulated on the column of the pixel dielectric interface during the x-ray exposure were now driven by this new distribution of electric field (16) as shown in FIG. 8. Charges moved from the dielectric interface (15) to the adjacent output data via (10) and were integrated by the charge amplifiers connected to each line as shown in FIG. 5. Image information of one column was therefore acquired. At the end of data acquisition of one column, the potential of the said column returned to the negative value and a next pixel column (8) was changed from negative to positive pushing the image charges of this next column (8) to the rows of data lines (13). This action was repeated until all the charges on the imaging panel were readout. For large area pixel, larger pixels can be constructed by binning a number of small pixel elements to so that the spacing between elements can be remained small for limited potential required for the charge push-pull transfer action. FIG. 9 and FIG. 10 show the 3-D plot of the electric field near the pixel during charge accumulation mode and readout mode respectively. FIG. 10 also shows that the electric field at the outer ring of the readout electrode is sufficient for the positive charge to undergo impact multiplication. Under this condition, impacting charge will produce more electron hole pairs and therefore charge gain is obtained. Since the high electric field is concentrated only at the outer ring of the readout electrode and also charges from the dielectric interface available for multiplication is limited, uncontrolled (or run-away) avalanche mode process can be avoided and the charge gain is achieved in the proportional mode.

The above examples show that the radiation imaging detector as well as the method for detecting radiation as described above are particularly useful for detecting radiation, whilst avoiding the problems associated with radiation detectors of the prior art, such as high background noise.

While the invention has been described in detail and with reference to specific examples thereof, it will be apparent to one skilled in the art that various changes and modifications can be made therein without departing from the spirit and scope thereof.

What is claimed is:

1. A radiation imaging detector comprising:
   a first dielectric layer;
   a plurality of first electrodes disposed on the first dielectric layer;
   a second dielectric layer disposed on the first dielectric layer;
   a plurality of second electrodes disposed on the second dielectric layer;
   a third dielectric layer disposed on the second electrodes and the second dielectric layer; and
   a plurality of vias disposed on the first electrodes and penetrating the second dielectric layer and the third dielectric layer.

2. The radiation imaging detector of claim 1, wherein the first electrodes are row read-out electrodes, and the second electrodes are column buried electrodes which are buried by the third dielectric layer.

3. The radiation imaging detector of claim 2, further comprising a plurality of charge amplifiers connected to the first electrodes respectively.

4. The radiation imaging detector of claim 1, further comprising:
   a radiation charge conversion layer disposed on the third dielectric layer and the vias; and
   a top bias electrode disposed on the radiation charge conversion layer.

5. The radiation imaging detector of claim 4, wherein the second electrodes are column buried electrodes which are buried by the third dielectric layer, and
   wherein, during exposure of radiation, a first bias potential is applied to the top bias electrode, and a second bias potential is applied to the column buried electrodes to form an electric field between the top bias electrode and the column buried electrodes, thereby charges being accumulated at an interface between the third dielectric layer and the radiation charge conversion layer.

6. The radiation imaging detector of claim 5, wherein the first electrodes are row read-out electrodes, and
   wherein, upon completion of the exposure of radiation, the potential of the column buried electrodes are changed from the second bias potential to the first bias potential, and the accumulated charges are transferred to a data line through the first electrodes.

7. The radiation imaging detector of claim 6, wherein the first bias potential is positive and the second bias potential is negative.

8. The radiation imaging detector of claim 4, wherein the radiation charge conversion layer comprises amorphous selenium.

9. The radiation imaging detector of claim 1, wherein the second dielectric layer and the third dielectric layer comprise silicon dioxide ($SiO_2$).

10. A radiation imaging detection method using a radiation imaging detector wherein the radiation imaging detector includes a first dielectric layer; a plurality of first electrodes disposed on the first dielectric layer; a second dielectric layer disposed on the first dielectric layer; a plurality of second electrodes disposed on the second dielectric layer; a third dielectric layer disposed on the second electrodes and the second dielectric layer; a plurality of vias disposed on the first electrodes and penetrating the second dielectric layer and the third dielectric layer; a radiation charge conversion layer disposed on the third dielectric layer and the vias; and a top bias electrode disposed on the radiation charge conversion layer,
   the method comprising:
   applying, during exposure of radiation, a positive bias potential to the top bias electrode, and applying a negative bias potential to the second electrodes to form an electric field between the top bias electrode and the second electrodes;
   changing, during readout of the exposure of radiation, the potential of the second electrodes from negative to positive; and digitizing a resulting charge value corresponding to charges transferred to a data line through the first electrodes.

11. The radiation imaging detection method of claim 10, wherein the second electrodes are column buried electrodes which are buried by the third dielectric layer.

12. The radiation imaging detection method of claim 11, wherein the first bias potential is positive and the second bias potential is negative.

13. The radiation imaging detection method of claim 10, wherein the radiation charge conversion layer comprises amorphous selenium.

14. The radiation imaging detector of claim 10, wherein the second dielectric layer and the third dielectric layer comprise silicon dioxide (SiO2).

15. A radiation imaging detection method using a radiation imaging detector wherein the radiation imaging detector includes a first dielectric layer; a plurality of first electrodes disposed on the first dielectric layer; a second dielectric layer disposed on the first dielectric layer; a plurality of second electrodes disposed on the second dielectric layer; a third dielectric layer disposed on the second electrodes and the second dielectric layer; a plurality of vias disposed on the first electrodes and penetrating the second dielectric layer and the third dielectric layer; a radiation charge conversion layer disposed on the third dielectric layer and the vias; and a top bias electrode disposed on the radiation charge conversion layer, the method comprising:
applying, during exposure of radiation, a negative bias potential to the top bias electrode, and applying a positive bias potential to the second electrodes to form an electric field between the top bias electrode and the second electrodes;
changing, during readout of the exposure of radiation, the potential of the second electrodes from positive to negative; and
digitizing a resulting charge value corresponding to charges transferred to a data line through the first electrodes.

* * * * *